(12) United States Patent
Lin

(10) Patent No.: US 12,557,389 B2
(45) Date of Patent: Feb. 17, 2026

(54) ELECTRONIC DEVICE

(71) Applicant: InnoLux Corporation, Miao-Li County (TW)

(72) Inventor: Chun-Hsien Lin, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 14 days.

(21) Appl. No.: 18/663,388

(22) Filed: May 14, 2024

(65) Prior Publication Data

US 2024/0297187 A1    Sep. 5, 2024

Related U.S. Application Data

(63) Continuation of application No. 17/502,556, filed on Oct. 15, 2021, now abandoned.

(30) Foreign Application Priority Data

Oct. 23, 2020    (CN) .................... 202011144532.4
Sep. 30, 2021    (CN) .................... 202111158715.6

(51) Int. Cl.
   *H10D 86/60*    (2025.01)
   *H10D 86/40*    (2025.01)

(52) U.S. Cl.
   CPC ........... *H10D 86/60* (2025.01); *H10D 86/443* (2025.01)

(58) Field of Classification Search
   CPC ................... H01L 27/1244; G02F 1/136272
   See application file for complete search history.

(56) References Cited

U.S. PATENT DOCUMENTS

| | | | |
|---|---|---|---|
| 8,232,933 B2 | 7/2012 | Kim | |
| 2006/0113551 A1* | 6/2006 | Kwak | G09G 3/3233 257/85 |
| 2015/0138171 A1 | 5/2015 | Kim | |

FOREIGN PATENT DOCUMENTS

| | | |
|---|---|---|
| CN | 1779763 A | 5/2006 |
| CN | 101226719 A | 7/2008 |
| CN | 103440840 A | 12/2013 |
| CN | 207165217 U | 3/2018 |
| CN | 109887986 A | 6/2019 |

OTHER PUBLICATIONS

Chinese language office action dated Aug. 17, 2024, issued in application No. CN 202111158715.6.

* cited by examiner

*Primary Examiner* — James A Dudek
(74) *Attorney, Agent, or Firm* — McClure, Qualey & Rodack, LLP

(57) ABSTRACT

An electronic device includes a panel having a working area. The working area includes a unit circuit, at least two first repairing lines, at least one second repairing line, and data, scan, and emission lines. The unit circuit includes first, second and third switches. The first switch is electrically connected to the second and third switches and a power line. The first repairing lines are extend in the first direction. The second repairing line extends in a second direction. The data line is extends in the first direction and is electrically connected to an electrode of the third switch. The scan line extends in the second direction and is electrically connected to a gate of the third switch. The emission line extends in the second direction and is electrically connected to a gate of the second switch. The first direction is different from the second direction.

18 Claims, 5 Drawing Sheets

ELECTRONIC DEVICE

CROSS REFERENCE TO RELATED APPLICATIONS

This application is a Continuation of U.S. patent application Ser. No. 17/502,556, filed Oct. 15, 2021, which claims priority of China Patent Application No. 202011144532.4, filed on Oct. 23, 2020, and China Patent Application No. 202111158715.6, filed on Sep. 30, 2021, the entirety of which is incorporated by reference herein.

BACKGROUND OF THE DISCLOSURE

Field of the Disclosure

The present disclosure relates to an electronic device, and in particular it relates to an electronic device having repairing lines.

Description of the Related Art

A defect may occur in the signal line (such as a scan line, a data line, a power line, or a signal driving line) of a conventional electronic device due to a particle or an electrostatic discharge (ESD). Therefore, the signal line needs to be repaired to eliminate the defect. However, the current manner of repairing signal lines is time-consuming, and the repair design is very complex. Therefore, a new repair design is needed to solve the above problem.

BRIEF SUMMARY OF THE DISCLOSURE

An embodiment of the disclosure provides an electronic device, which comprises a panel. The panel has a working area, and the working area includes a unit circuit, at least two first repairing lines, at least one second repairing line, at least one data line, at least one scan line and an emission line. The unit circuit includes a first switch, a second switch and a third switch. The first switch is electrically connected to the second switch, the third switch and a power line. The at least two first repairing lines are disposed on the periphery of the unit circuit and extend in the first direction. The at least one second repairing line is disposed on the periphery of the unit circuit and extends in a second direction. The at least one data line extends in the first direction and is electrically connected to an electrode of the third switch. The at least one scan line extends in the second direction and is electrically connected to a gate of the third switch. The emission line extends in the second direction and is electrically connected to a gate of the second switch. The first direction is different from the second direction. The at least two first repairing lines extend across all the scan line, and the at least one second repairing line extends across all the data line. One of the at least two first repairing lines and one of the at least one second repairing line are electrically connected through a contact via.

BRIEF DESCRIPTION OF THE DRAWINGS

The disclosure can be fully understood by reading the subsequent detailed description and examples with references made to the accompanying drawings, wherein.

DETAILED DESCRIPTION OF THE DISCLOSURE

Figure 1:
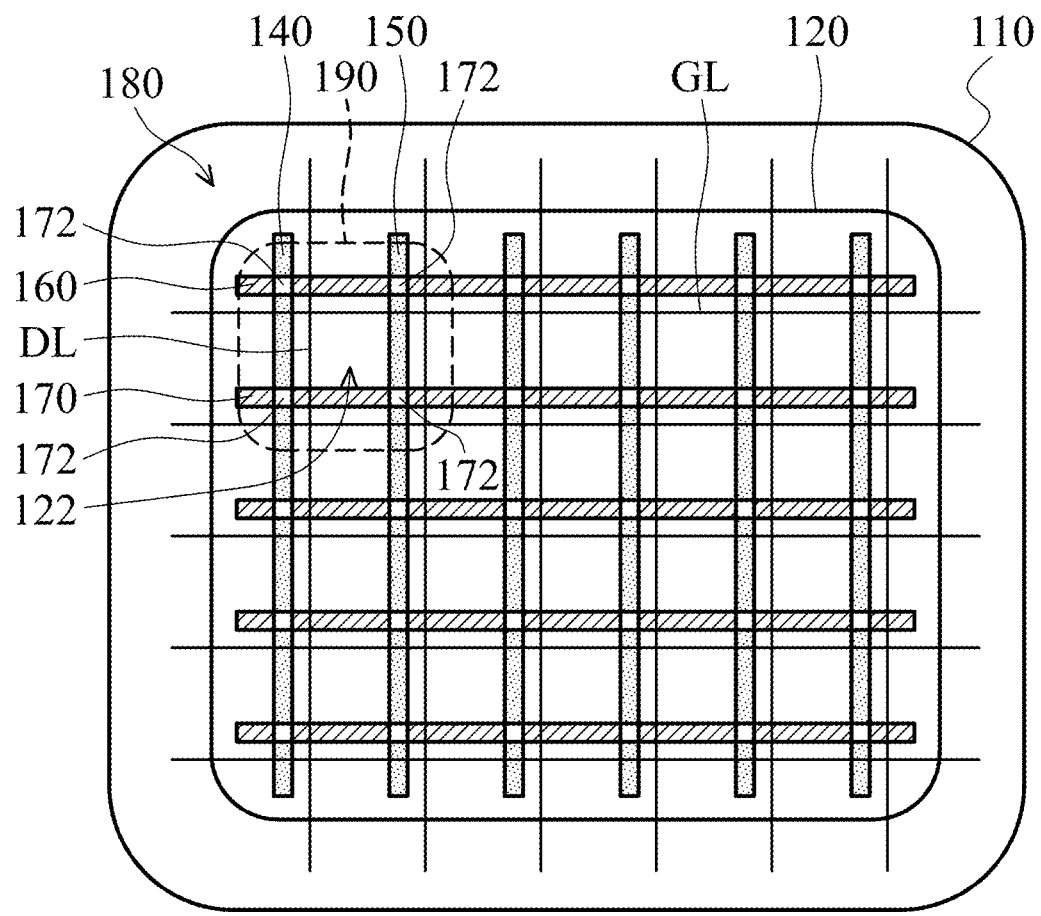
FIG. 1 is a schematic view of an electronic device according to an embodiment of the disclosure.

In order to make objects, features and advantages of the disclosure more obvious and easily understood, the embodiments are described below, and the detailed description is made in conjunction with the drawings. In order to help the reader to understand the drawings, the multiple drawings in the disclosure may merely depict a part of the entire device, and the specific components in the drawing are not drawn to scale.

The specification of the disclosure provides various embodiments to illustrate the technical features of the various embodiments of the disclosure. The configuration, quantity, and size of each component in the embodiments are for illustrative purposes only, and are not intended to limit the disclosure. In addition, if the reference number of a component in the embodiments and the drawings appears repeatedly, it is for the purpose of simplifying the description, and does not mean to imply a relationship between different embodiments.

Furthermore, use of ordinal terms such as "first", "second", etc., in the specification and the claims to describe a claim element does not by itself connote and represent the claim element having any previous ordinal term, and does not represent the order of one claim element over another or the order of the manufacturing method, either. The ordinal terms are used merely as labels to distinguish one claim element having a certain name from another element having the same name.

In the disclosure, the technical features of the various embodiments may be replaced or combined with each other to complete other embodiments without being mutually exclusive.

FIG. 1 is a schematic view of an electronic device according to an embodiment of the disclosure. In an embodiment, the electronic device may include a display device, a backlight device, an antenna device, a sensing device or a splicing device, but the disclosure is not limited thereto. The electronic device may be a bendable or flexible electronic device. The display device may be a non-self-luminous type display device or a self-luminous type display device. The antenna device may be a liquid-crystal type antenna device or a non-liquid-crystal type antenna device, and the sensing device may be a sensing device that senses capacitance, light, heat or ultrasound, but the disclosure is not limited thereto. The electronic component may include a passive component and an active component, such as a capacitor, a resistor, an inductor, a diode, a transistor, etc. The diode may include a light-emitting diode or a photodiode. The light-emitting diode may include, for example, an organic light emitting diode (OLED), a mini LED, a micro LED or a quantum dot LED, but the disclosure is not limited thereto. The splicing device may be, for example, a display splicing device or an antenna splicing device, but the disclosure is not limited thereto. It should be noted that the electronic device may be any arrangement and combination of the above devices, but the disclosure is not limited thereto. Hereinafter, the display device will be used as an electronic device or a splicing device to illustrate to the content of the disclosure, but the disclosure is not limited thereto.

Figure 2:
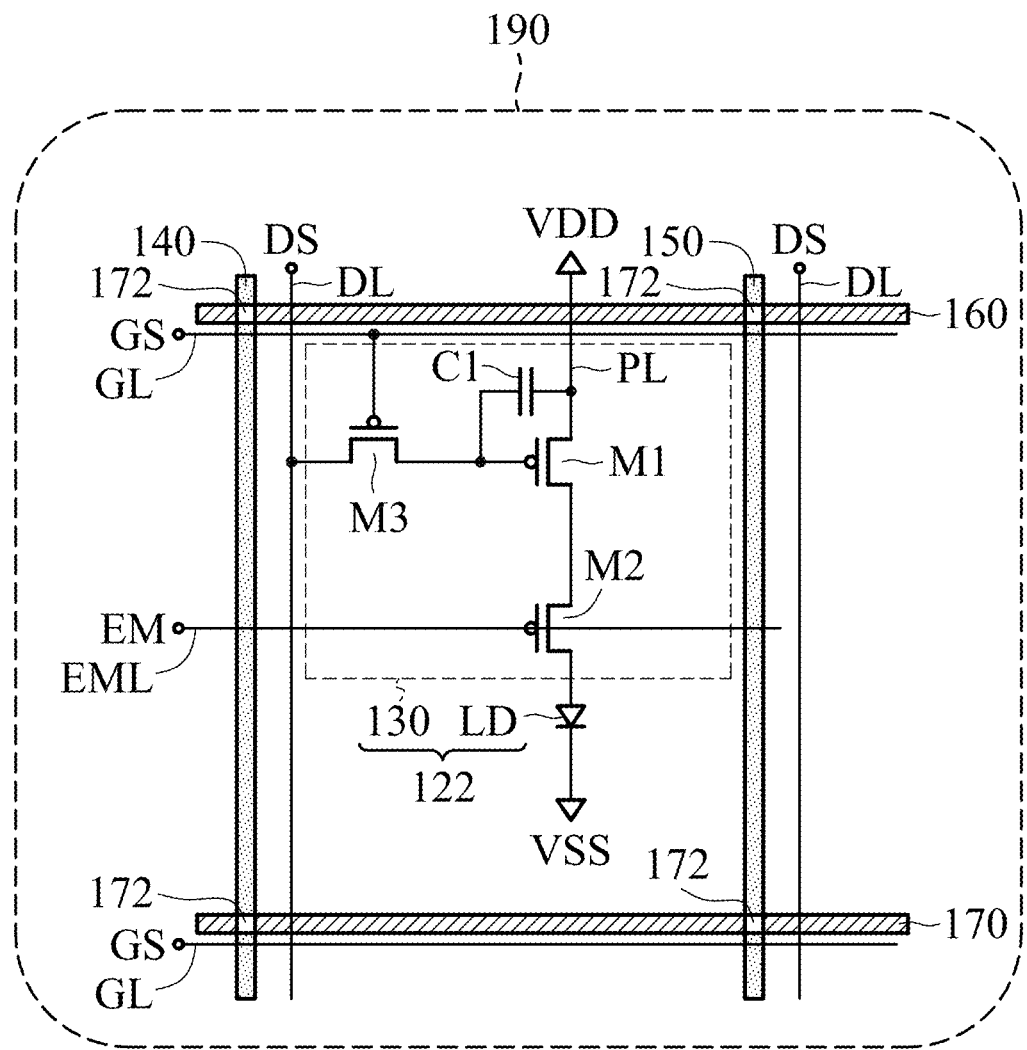
FIG. 2 is an enlarged schematic diagram of a dashed frame 190 of the electronic device in FIG. 1.

Please refer to FIG. 1. The electronic device 100 may include a panel 110. The panel 110 may have a working area 120 and a peripheral area 180. The panel 110 may include a unit 122, at least two first repairing lines (for example, a first repairing line 140, and a first repairing line 150), and at least one second repairing line (for example, a second repairing line 160 and/or a second repairing line 170). According to some embodiments, a number of the at least one second repairing line is greater than or equal to two. The unit 122 may include a unit circuit 130 and an electronic component LD electrically connected to the unit circuit 130, as shown in FIG. 2. The panel 110 may further include a data line DL and a scan line GL. According to some embodiments, the data line DL and the scan line GL may be disposed in the working area 120 and extended to the peripheral area 180. According to some embodiments, the unit 122 may be an area enclosed by the data line DL and the scan line GL.

According to some embodiments, the at least two first repairing lines may be disposed on the periphery of the unit circuit 130 and extended in a first direction. That is, the first repairing line 140 and the first repairing line 150 may be disposed on the periphery of the unit circuit 130 and extended in a first direction. For example, the first repairing line 140 and the first repairing line 150 may be substantially disposed in parallel, and the first repairing line 140 and the first repairing line 150 are respectively disposed on two opposite sides of the unit circuit 130, but the disclosure is not limited thereto.

According to some embodiments, the least one second repairing line may be disposed on the periphery of the unit circuit 130 and extended in a second direction. That is, the second repairing line 160 and/or the second repairing line 170 may be disposed on the periphery of the unit circuit 130 and extended long the second direction. In the embodiment, the first direction may be different from the second direction. In some embodiments, the first direction may be a Y direction, and the second direction may be an X direction, but the disclosure is not limited thereto. In some embodiments, the first direction may be the X direction, and the second direction may be the Y direction. In the embodiment, the data line DL may substantially extend in the first direction, and the scan line GL may substantially extend in the second direction.

In some embodiments, the working area 120 may further include a second repairing line 170. That is, the working area 120 may also have at least two second repairing lines, such as the second repairing line 160 and the second repairing line 170. In addition, the second repairing line 170 is also disposed on the periphery of the unit circuit 130 and extends in the second direction. For example, the second repairing line 160 and the second repairing line 170 may also be substantially disposed in parallel, and the second repairing line 160 and the second repairing line 170 are respectively disposed on the two opposite sides of the unit circuit 130, but the disclosure is not limited thereto.

In some embodiments, the peripheral area 180 may be a non-working area of the panel 110, and the peripheral area 180 may include driving circuits used by the electronic device 100, such as a scan driving circuit, a data driving circuit, a timing control circuit, etc., but the disclosure is not limited thereto.

In addition, in FIG. 1, the first repairing line 140, the first repairing line 150, the second repairing line 160 and the second repairing line 170 are disposed in the working area 120 and respectively extended in the working area 120 in the first direction or the second direction, but the disclosure is not limited thereto. In some embodiments, the first repairing line 140, the first repairing line 150, the second repairing line 160 and the second repairing line 170 may also be extended to the peripheral area 180, and the same effect may also be achieved.

In some embodiments, the at least two first repairing lines and the at least one second repairing line are made of different layers. For example, the first repairing line 140 and the first repairing line 150 and the second repairing line 160 and the second repairing line 170 may be made of different layers. For example, the first repairing line 140 and the first repairing line 150 and the second repairing line 160 and the second repairing line 170 may be made of different metal layers. That is, the second repairing line 160 and the second repairing line 170 are, for example, made of a first metal layer, and the first repairing line 140 and the first repairing line 150 are, for example, made of a second metal layer, wherein the first metal layer and the second metal layer are different layers, but the disclosure is not limited thereto. In some embodiments, the second repairing line 160 and the second repairing line 170 and the scan line GL may be made of the same layer, i.e., the second repairing line 160, the second repairing line 170 and the scan line GL may be produced on in the same process. Similarly, the at least two first repairing lines and the data line DL are made of the same layer. For example, the first repairing line 140 and the first repairing line 150 and the data line DL may be made of the same layer, i.e., the first repairing line 140, the first repairing line 150 and the data line DL may be produced in the same process. In addition, the first repairing line 140 and the first repairing line 150 and the second repairing line 160 and the second repairing line 170 may be electrically connected. According to some embodiments, one of the at least two first repairing lines and one of the at least one second repairing line are electrically connected at an intersection through a contact via. For example, the first repairing line 140 and the first repairing line 150 and the second repairing line 160 and the second repairing line 170 may be electrically connected at intersections through a contact via 172, but the disclosure is not limited thereto.

Furthermore, before the electronic device 100 does not perform a repairing operation, the first repairing line 140, the first repairing line 150, the second repairing line 160, and the second repairing line 170 may also be configured to have a function of electrostatic discharge protection, but the disclosure is not limited thereto.

FIG. 2 is an enlarged schematic diagram of a dashed frame 190 of the electronic device in FIG. 1. Please refer to FIG. 2. The panel 110 may further include a power line PL and an emission line EML. In addition, the unit circuit 130 may include a switch M1, a switch M2, a switch M3 and a capacitor C1. According to some embodiments, the power line PL may be extended in the first direction and be electrically connected to the unit circuit 130. The emission line EML may be extended in the second direction and be electrically connected to the unit circuit 130.

The switch M1 is electrically connected to the power line PL. In an embodiment, the switch M1 may be a thin film transistor (TFT), but the disclosure is not limited thereto. Furthermore, an electrode of the switch M1 may be electrically connected to the power line PL to receive a power source VDD through the power line PL. The switch M2 is electrically connected to the switch M1. In an embodiment, the switch M2 may be the thin film transistor, but the disclosure is not limited thereto. In addition, a gate of the switch M2 may be electrically connected to the emission line EML to receive an emission signal EM through the emission line EML.

The capacitor C1 is electrically connected to the switch M1. Furthermore, a first terminal of the capacitor C1 may be electrically connected to a gate of the switch M1, and a second terminal of the capacitor C1 may be electrically connected to an electrode of the switch M1, such as a source.

The switch M3 is electrically connected to the switch M1. In an embodiment, the switch M3 may be the thin film transistor, but the disclosure is not limited thereto. According to some embodiments, the scan line GL and the data line DL may be respectively electrically connected to the unit circuit 130. Furthermore, a gate of the switch M3 of the unit circuit 130 may be electrically connected to the scan line GL to receive a scan signal GS through the scan line GL. An electrode (such as the source) of the switch M3 of the unit circuit 130 may be electrically connected to the data line DL to receive a data signal DS through the data line DL.

The electronic component LD is electrically connected to the switch M2. Furthermore, a first terminal (such as an anode terminal) of the electronic component LD is electrically connected to an electrode of the switch M2, and a second terminal (such as a cathode terminal) of the electronic component LD is electrically connected to a reference voltage VSS (such as a ground voltage). In the embodiment, the electronic component LD may be the OLED, the LED, the mini LED, the micro LED, the QLED/QD-LED, or a combination thereof, but the disclosure is not limited thereto.

In some embodiments, the at least two first repairing lines and the data line DL do not overlap in the top view direction of the panel 110. For example, the first repairing line 140 and the first repairing line 150 do not overlap the data line DL in the third direction. In the embodiment, the third direction may be different from the first direction and the second direction. In some embodiment, the third direction may be a Z direction (such as a top view direction of the panel 110), but the disclosure is not limited thereto. In other words, the third direction may be substantially perpendicular to the first direction and the second direction. In addition, the second repairing line 160 and the second repairing line 170 do not also overlap the scan line GL in the third direction (such as the top view direction of the panel 110). Furthermore, the second repairing line 160 and the second repairing line 170 do not also overlap the emission line EML in the third direction (such as the top view direction of the panel 110).

In some embodiments, the at least two first repairing lines and the at least one second repairing line are electrically connected to the power line PL. For example, the first repairing line 140, the first repairing line 150, the second repairing line 160 and the second repairing line 170 may be electrically connected to the power line to reduce resistance, but the disclosure is not limited thereto.

The above embodiments have described the configuration relationship of the components in the electronic device 100. Some embodiments are provided below to illustrate how to perform a repair operation when the electronic device 100 develops a defect.

Figure 3:
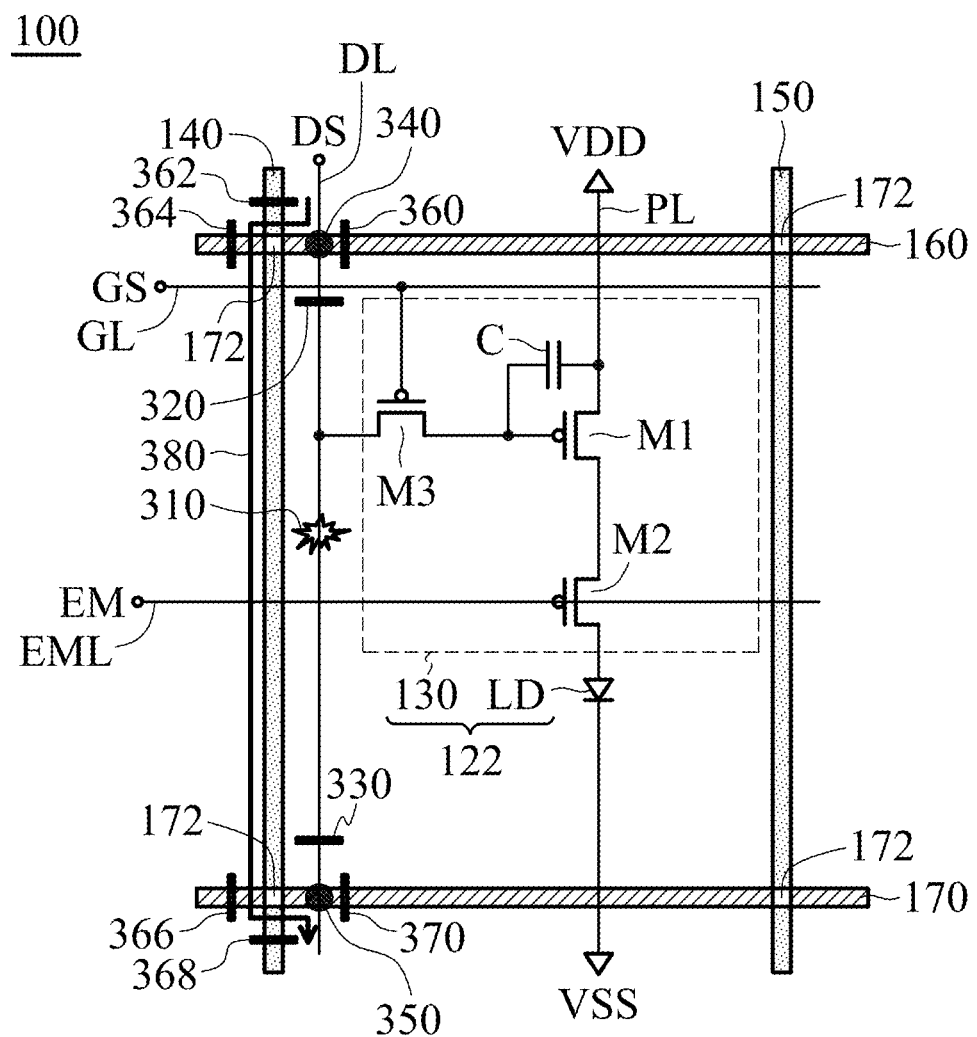
FIG. 3 is a schematic view of a repair operation of an electronic device according to an embodiment of the disclosure.

FIG. 3 is a schematic view of a repair operation of an electronic device according to an embodiment of the disclosure. Please refer to FIG. 3. Assume that when a position 310 of the data line DL is damaged by a particle or an electrostatic discharge, causing a defect: a laser beam of a laser light source may be used, for example, to perform a cutting operation (i.e. a laser cutting operation) on the data line DL at a position 320 and a position 330, so as to cut the data line DL corresponding to the position 320 and the position 330 and then to isolate the data signal DS and the defect in the position 310. Therefore, the unit 122 may be a dead unit.

In addition, two of the at least one second repairing line and one of the at least two first repairing lines are electrically connected to the data line DL. For example, the laser beam of the laser light source is used to perform a welding operation (such as a laser welding operation) for the data line DL, the second repairing line 160 and the second repairing line 170 at a position 340 and a position 350, such that the data line DL is electrically connected to the first repairing line 140, the second repairing line 160 and the second repairing line 170 at the position 340 and the position 350. Furthermore, the laser beam of the laser light source is used to perform the laser cutting operation for the second repairing line 160 and the second repairing line 170 at a position 360, a position 362, a position 364, a position 366, a position 368 and a position 370, so as to cut the second repairing line 160 and the second repairing line 170 corresponding to the position 360, the position 362, the position 364, the position 366, the position 368 and the position 370. Therefore, the data signal DS transmitted by the data line DL may be transmitted through a signal transmission path 380, so as to achieve a repair effect. In addition, the transmission of the data signal DS may be operated normally and the data signal DS may be transmitted to the unit circuit 130 of the next unit 122.

In FIG. 3, the position 310 where the defect occurs on the data line DL of the electronic device 100 is an exemplary embodiment of the disclosure, but the implementation of the disclosure is not limited thereto. A defect may occur in other positions of the data line DL, the manner of repairing defects that develop in other positions may be deduced by analogy from the embodiment of FIG. 3, and the description thereof is not repeated herein. Therefore, the same repair effect may also be achieved.

Figure 4:
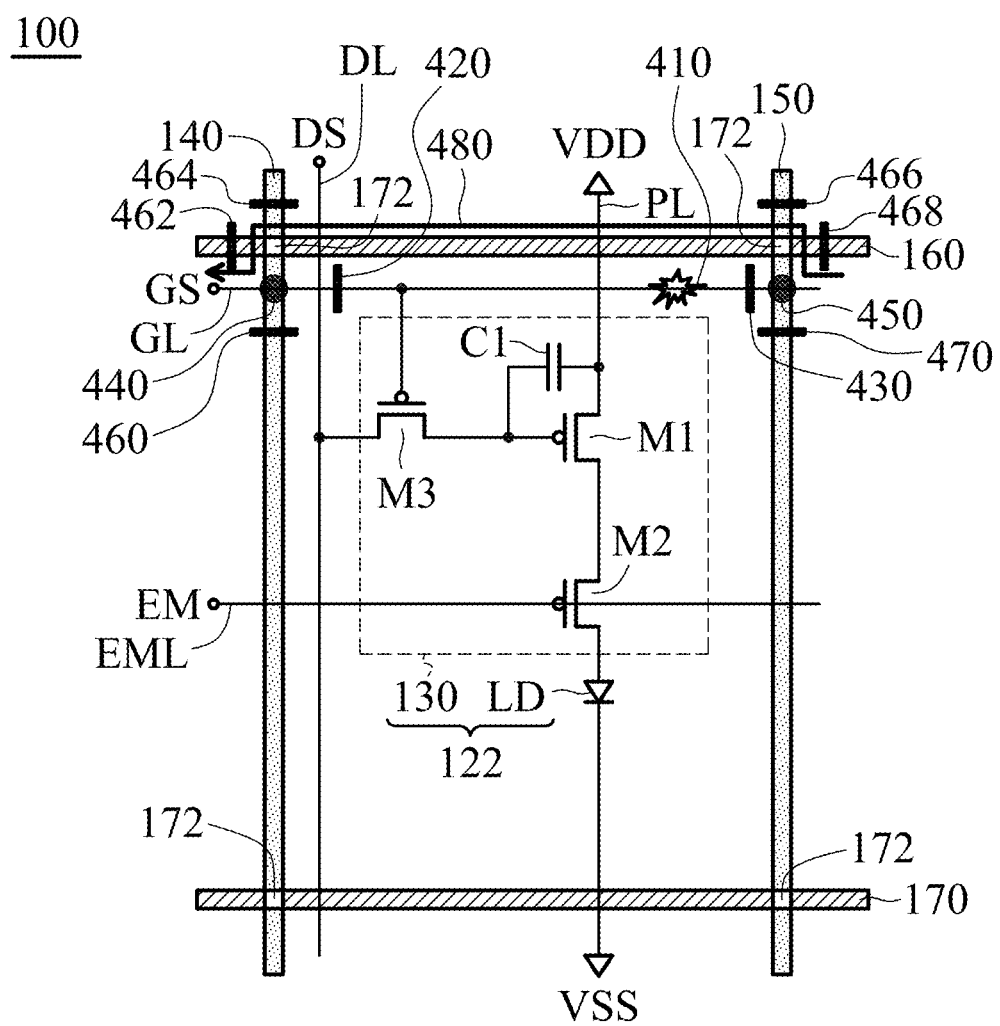
FIG. 4 is a schematic view of a repair operation of an electronic device according to an embodiment of the disclosure.

FIG. 4 is a schematic view of a repair operation of an electronic device according to an embodiment of the disclosure. Please refer to FIG. 4. Assume that when a position 410 of the scan line GL of the electronic device 100 is damaged by the particle or the electrostatic discharge, causing a defect: the laser beam of the laser light source may be used, for example, to perform the a cutting operation on the scan line GL at a position 420 and a position 430 of the electronic device 100, so as to cut the scan line GL corresponding to the position 420 and the position 430, and then to isolate the scan signal GS and the defect in the position 410. Therefore, the unit 122 may be a dead unit.

In addition, the at least two first repairing lines and the at least one second repairing line are electrically connected to the scan line GL. For example, the laser beam of the laser light source is used to perform the laser welding operation for the scan line GL, the first repairing line 140 and the first repairing line 150 at a position 440 and a position 450, such that the scan line GL may be electrically connected to the first repairing line 140, the first repairing line 150 and the second repairing line 160 at the position 440 and the position 450. Furthermore, the laser beam of the laser light source is used to perform the laser cutting operation for the first repairing line 140 and the first repairing line 150 at a position 460, a position 462, a position 464, a position 466, a position 468 and a position 470 of the electronic device 100, so as to cut the first repairing line 140 and the first repairing line 150 corresponding to the position 460, the position 462, the position 464, the position 466, the position 468 and the position 470. Therefore, the scan signal GS transmitted by the scan line GL may be transmitted through a signal transmission path 480, so as to achieve a repair effect. In addition, the transmission of the scan signal GS may be operated normally and the scan signal GS may be transmitted to the unit circuit 130 of the next unit 122.

In FIG. 4, the position 410 where the defect occurs on the scan line GL of the electronic device 100 is an exemplary embodiment of the disclosure, but the implementation of the disclosure is not limited thereto. A defect may occur in other positions of the scan line GL, the manner of repairing defects that develop in other positions may be deduced by analogy from the embodiment of FIG. 4, and the description thereof is not repeated herein. Therefore, the same repair effect may also be achieved.

Figure 5:
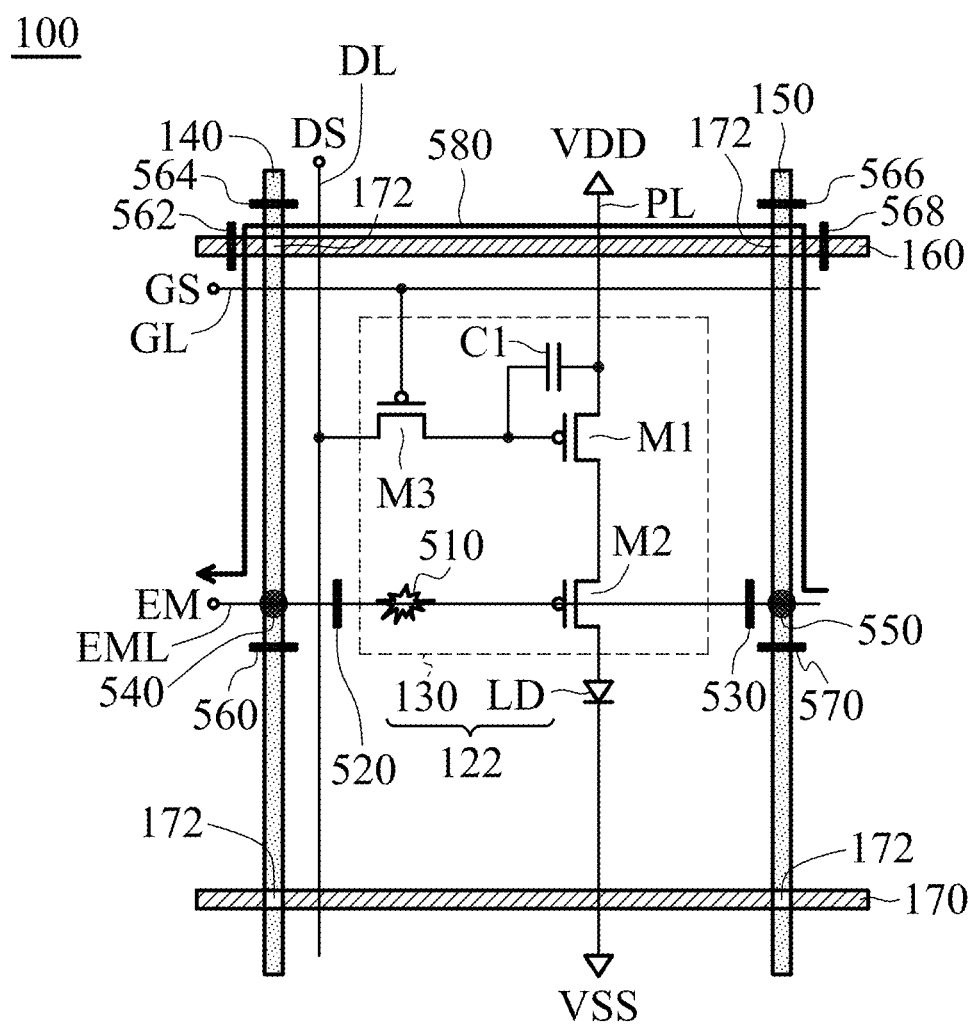
FIG. 5 is a schematic view of a repair operation of an electronic device according to an embodiment of the disclosure.

FIG. 5 is a schematic view of a repair operation of an electronic device according to an embodiment of the disclosure. Please refer to FIG. 5. Assume that when a position 510 of the emission line EML is damaged by the particle or the electrostatic discharge, causing a defect: the laser beam of the laser light source may be used, for example, to perform the cutting operation on the emission line EML at a position 520 and a position 530, so as to cut the emission line EML corresponding to the position 520 and the position 530 and then to isolate the emission signal EM and the defect in the position 510. Therefore, the unit 122 may be a dead unit.

In addition, the at least two first repairing lines and the at least one second repairing line are electrically connected to the emission line EML. For example, the laser beam of the laser light source is used to perform the laser welding operation for the emission line EML, the first repairing line 140 and the first repairing line 150 at a position 540 and a position 550, such that the emission line EML may be electrically connected to the first repairing line 140, the first repairing line 150 and the second repairing line 160 at the position 540 and the position 550. Furthermore, the laser beam of the laser light source is used to perform the laser cutting operation for the first repairing line 140 and the first repairing line 150 at a position 560, a position 562, a position 564, a position 566, a position 568 and a position 570, so as to cut the first repairing line 140 and the first repairing line 150 corresponding to the position 560, the position 562, the position 564, the position 566, the position 568 and the position 570. Therefore, the emission signal EM transmitted by the emission line EML may be transmitted through a signal transmission path 580, so as to achieve a repair effect. In addition, the transmission of the emission signal EM may be operated normally and the emission signal EM may be transmitted to the unit circuit 130 of the next unit 122.

In FIG. 5, the position 510 where the defect occurs on the emission line EML of the electronic device 100 is an exemplary embodiment of the disclosure, but the implementation of the disclosure is not limited thereto. A defect may occur in other positions of the emission line EML, the manner of repairing defects that develop in other positions may be deduced by analogy from the embodiment of FIG. 5, and the description thereof is not repeated herein. Therefore, the same repair effect may also be achieved.

It can be seen from the above content that when the data line DL, the scan line GL, or the emission line EML of the electronic device 100 is damaged by the particle or the electrostatic discharge, causing a defect, the electronic device 100 be repaired in the working area 120 of the panel through the first repairing line 140, the first repairing line 150, the second repairing line 160 and/or the second repairing line 170, so as to decrease the repair time, decrease the complexity of the repair design or increase the convenience of use.

In summary, according to the electronic device the embodiments of the disclosure, the at least two first repairing lines and the at least one second repairing line are disposed in the working area of the panel of the electronic device, wherein the at least two first repairing lines are disposed on the periphery of the unit circuit and extend in the first direction, and the at least one second repairing line is disposed on the periphery of the unit circuit and extends in the second direction. Therefore, when the electronic device is damaged by a particle or an electrostatic discharge, causing a defect, the electronic device may be repaired in the working area through the first repairing lines and/or the second repairing line, so as to decrease the repair time, decrease the complexity of the repair design or increase the convenience of use.

While the disclosure has been described by way of examples and in terms of the preferred embodiments, it should be understood that the disclosure is not limited to the disclosed embodiments. On the contrary, it is intended to cover various modifications, combinations, and similar arrangements (as would be apparent to those skilled in the art). Therefore, the scope of the appended claims should be accorded the broadest interpretation to encompass all such modifications, combinations, and similar arrangements.

What is claimed is:

1. An electronic device, comprising:
a panel, having a working area, and comprising:
a unit circuit, comprising a first switch, a second switch and a third switch, wherein the first switch is electrically connected to the second switch, the third switch and a power line;
at least two first repairing lines, disposed on a periphery of the unit circuit and extending in a first direction;
at least one second repairing line, disposed on the periphery of the unit circuit and extending in a second direction;
at least one data line, extending in the first direction, and electrically connected to an electrode of the third switch;
at least one scan line, extending in the second direction, and electrically connected to a gate of the third switch; and
an emission line, extending in the second direction, and electrically connected to a gate of the second switch;
wherein the first direction is different from the second direction;
wherein the at least two first repairing lines extend across all the scan line, and the at least one second repairing line extends across all the data line;
wherein one of the at least two first repairing lines and one of the at least one second repairing line are electrically connected through a contact via;
wherein the at least two first repairing lines and the at least one second repairing line are electrically connected to the power line.

2. The electronic device according to claim 1, wherein the at least two first repairing lines and the at least one second repairing line are made of different layers.

3. The electronic device according to claim 1, further comprising an electronic component, electrically connected to the unit circuit.

4. The electronic device according to claim 1, wherein a number of the at least one second repairing line is two.

5. The electronic device according to claim 1, wherein the at least one data line is electrically connected to the unit circuit.

6. The electronic device according to claim 5, wherein two of the at least one second repairing line and one of the at least two first repairing lines are electrically connected to the at least one data line.

7. The electronic device according to claim 5, wherein the at least two first repairing lines and the at least one data line do not overlap in a top view direction of the panel.

8. The electronic device according to claim 5, wherein the at least two first repairing lines and the at least one data line are the same layer.

9. The electronic device according to claim 1, wherein the at least one scan line is electrically connected to the unit circuit.

10. The electronic device according to claim 9, wherein the at least two first repairing lines and the at least one second repairing line are electrically connected to the at least one scan line.

11. The electronic device according to claim 9, wherein the at least two first repairing lines and the at least one second repairing line are electrically connected to the emission line.

12. The electronic device according to claim 9, wherein the at least one second repairing line and the at least one scan line do not overlap in a top view direction of the panel.

13. The electronic device according to claim 12, wherein the top view direction is different from the first direction and the second direction.

14. The electronic device according to claim 9, wherein the at least one second repairing line and the emission line do not overlap in a top view direction of the panel.

15. The electronic device according to claim 14, wherein the top view direction is different from the first direction and the second direction.

16. The electronic device according to claim 9, wherein the at least one second repairing line and the scan line are the same layer.

17. The electronic device according to claim 1, wherein the at least two first repairing lines are disposed in parallel.

18. The electronic device according to claim 1, wherein before the electronic device does not perform a repairing operation, the at least two first repairing lines and the at least one second repairing line are configured to have a function of electrostatic discharge protection.

* * * * *